(12) United States Patent
Zhang et al.

(10) Patent No.: US 11,899,354 B1
(45) Date of Patent: Feb. 13, 2024

(54) ULTRAFAST PHOTOGRAPHING APPARATUS BASED ON POLARIZATION-TIME MAPPING

(71) Applicant: EAST CHINA NORMAL UNIVERSITY, Shanghai (CN)

(72) Inventors: Shi'an Zhang, Shanghai (CN); Dalong Qi, Shanghai (CN); Pengpeng Ding, Shanghai (CN); Yunhua Yao, Shanghai (CN); Yilin He, Shanghai (CN); Jiali Yao, Shanghai (CN); Chengzhi Jin, Shanghai (CN); Zihan Guo, Shanghai (CN); Zhenrong Sun, Shanghai (CN)

(73) Assignee: EAST CHINA NORMAL UNIVERSITY, Shanghai (CN)

( * ) Notice: Subject to any disclaimer, the term of this patent is extended or adjusted under 35 U.S.C. 154(b) by 0 days.

(21) Appl. No.: 18/323,125

(22) Filed: May 24, 2023

(30) Foreign Application Priority Data

Nov. 17, 2022  (CN) .......................... 202211439058.7

(51) Int. Cl.
| | |
|---|---|
| G02B 27/42 | (2006.01) |
| G02B 5/18 | (2006.01) |
| G03B 39/00 | (2021.01) |
| G03B 17/12 | (2021.01) |
| G06F 17/18 | (2006.01) |
| H04N 25/76 | (2023.01) |
| H04N 23/56 | (2023.01) |
| H01L 27/146 | (2006.01) |

(52) U.S. Cl.
CPC ............. G03B 39/00 (2013.01); G03B 17/12 (2013.01); G06F 17/18 (2013.01); H01L 27/14627 (2013.01); H04N 23/56 (2023.01); H04N 25/76 (2023.01)

(58) Field of Classification Search
USPC ......................................................... 396/439
See application file for complete search history.

(56) References Cited

U.S. PATENT DOCUMENTS

| | | | |
|---|---|---|---|
| 9,706,094 B2 * | 7/2017 | Frayer .................. | G02B 5/1842 |
| 10,600,837 B2 * | 3/2020 | Tsuchiya ................ | G01R 29/08 |

FOREIGN PATENT DOCUMENTS

CN           113296346 A   *   8/2021

* cited by examiner

*Primary Examiner* — Clayton E. LaBalle
*Assistant Examiner* — Warren K Fenwick

(57) ABSTRACT

Disclosed is ultrafast photographing apparatus based on polarization-time mapping, which can obtain spatiotemporal (x, y, t) information of a dynamic scene by means of single exposure. The apparatus includes an active illumination system, a synchronous control system, a data acquisition system, and a data reconstruction system. Firstly, illumination light is generated by the active illumination system to irradiate on a dynamic scene; the synchronous control system is configured to control the single exposure of a camera; the data acquisition system is configured to acquire a two-dimensional image containing sixteen frames of spatiotemporal aliasing by means of polarization modulation and polarization filtering; and the data reconstruction system is configured to reconstruct the acquired image by using an iterative Tikhonov regularization algorithm, and finally to restore sixteen frames of original dynamic scenes with time series information.

5 Claims, 3 Drawing Sheets

ULTRAFAST PHOTOGRAPHING APPARATUS BASED ON POLARIZATION-TIME MAPPING

CROSS-REFERENCE TO RELATED APPLICATION

This patent application claims the benefit and priority of Chinese Patent Application No. 202211439058.7, filed with the China National Intellectual Property Administration on Nov. 17, 2022, the disclosure of which is incorporated by reference herein in its entirety as part of the present application.

TECHNICAL FIELD

The present disclosure relates to the fields of ultrafast optics, image reconstruction and polarization modulation, including data acquisition and reconstruction, so as to obtain a dynamic scene containing two-dimensional spatial and one-dimensional temporal information, in particular to novel ultrafast photographing apparatus. Due to the features of the novel imaging mode, the apparatus can be used in laser ablation, fundamental physics, biomedicine, information transmission, and other fields.

BACKGROUND

In scientific research, single-shot ultrafast optical imaging (UOI) technology plays an important role in detecting ultrafast scenes, especially in the aspect of capturing irreversible or random dynamic scenes. UOI can capture the spatiotemporal information of dynamic scenes from nanosecond to femtosecond time scales, so it has become a research hotspot in recent years. In the past ten years, the single-shot UOI has achieved leaping developments with the help of light field manipulation or information multiplexing. For the single-shot UOI needing active illumination, a time-stamped illumination light is required to detect the dynamic scene, and various photon tags are used to map temporal information of the dynamic scene, including the wavelength, angle, space, and spatial frequency of the illumination light. In the wavelength domain, the illumination light is a spectral discrete laser pulse sequence or modulated chirped laser pulses obtained by phase-modulated pulse shaping devices, e.g., sequentially timed all-optical mapping photography (STAMP) or chirped spectral mapping ultrafast photography (CSMUP). In the angle domain, the illumination light is a number of time-lapse angular-separated femtosecond laser pulses obtained by a four-wave mixing method, e.g., single-shot Fourier domain tomography (SS-FDT). In the spatial domain, the illumination light is a number of time-lapse spatially-segmented femtosecond laser pulses obtained by inserting an echelon. In the spatial frequency domain, the illumination light is a spatial frequency-resolved laser pulse sequence obtained by introducing Ronchi grating into each sub-pulse, e.g., a frequency recognition algorithm for multiple exposures (FRAME). In the above single-shot UOI technologies, the temporal information of dynamic scenes is mapped to the wavelength, angle, space, and spatial frequency dimensions of illumination light, respectively. However, there is no technology to map the temporal information to the polarization dimension to achieve ultrafast detection of dynamic scenes in a single exposure.

SUMMARY

An objective of the present disclosure is to provide ultrafast photographing apparatus based on polarization-time mapping for the existing single-shot ultrafast optical imaging technologies, which can convert temporal information into polarization dimension, so as to achieve spatiotemporally three-dimensional ultrafast detection of dynamic scenes. The apparatus includes an active illumination system, a data acquisition system, a synchronous control system, and a data reconstruction system. The data acquisition system is configured to obtain a two-dimensional image containing sixteen spatiotemporal aliasing sub-images, and then the data reconstruction system is configured to reconstruct the acquired image. That is, an iterative Tikhonov regularization algorithm is used to perform deconvolution on the sixteen frames of images to finally obtain the information with single polarization angles, i.e., time series information with isolated time instants.

The specific technical solution for achieving the objective of the present disclosure is as follows:

Ultrafast photographing apparatus based on polarization-time mapping includes an active illumination system, which is composed of a femtosecond laser system, a pulse stretcher, a first mirror, a second mirror and a scattering medium which are optically connected in sequence; a data acquisition system, which is composed of a dynamic scene, a microscope objective, a linear polarizer, a first lens, an optical rotational dispersion crystal, a second lens, a microlens array, a third lens, a shutter, a linear polarizer array, and a high-sensitivity CMOS camera which are optically connected in sequence, where the dynamic scene is optically connected to the scattering medium in the active illumination system; a synchronous control system, which is composed of a digital delay generator and is connected to the femtosecond laser system in the active illumination system, as well as the shutter and the high-sensitivity CMOS camera in the data acquisition system; and a data reconstruction system, which is composed of a computer and is connected to the high-sensitivity CMOS camera in the data acquisition system.

A femtosecond laser pulse generated by the femtosecond laser system of the active illumination system has a pulse duration of 60 fs, a wavelength range from 780 nm to 820 nm, a spectral bandwidth of 40 nm, a repetition frequency of 100 Hz, and single pulse energy of at least 3 mJ. The pulse stretcher can cover the chirping range of the femtosecond laser pulse from 2 ps to 200 ps. The scattering medium is an engineering scatterer and is configured to perform de-coherence on the laser pulse.

The linear polarizer of the data acquisition system is a linear polarizer with a high extinction ratio, and the extinction ratio of the linear polarizer in the wavelength range from 780 nm to 820 nm is at least 5000:1, thus guaranteeing that the transmitted light is linearly polarized. The microlens array is a 4×4 lens array for generating sixteen sub-beams, where the size of an individual sub-lens can be from 500 μm to 1 mm, the focal length of the sub-lens is at least 60 mm, and the spacing distance between the sub-lenses can be from 20 μm to 50 μm. The optical rotational dispersion crystal is a right-handed quartz optically active crystal with a thickness of 140 mm, which is configured to modulate the wavelength range from 780 nm to 820 nm, and enable a polarization angle of the spectral bandwidth of 40 nm to just rotate by 180 degrees; and a mapping relationship between the polarization and time is obtained by further utilizing the relationship between spectrum and time mapping. The fastest opening and closing response time of the shutter in an external trigger mode is 5 ms, so as to capture a single laser pulse. The linear polarizer array is a 4×4 linear polarizer array, the size of each sub-linear polarizer is 3 mm×3 mm, the spacing distance between the sub-linear polarizers is 300 μm, and the extinction ratio of the sub-linear polarizer is at least 2000:1. An included angle between a polarization direction of the first sub-linear polarizer and a horizontal polarization direction is 11.25 degrees, an included angle between a polarization direction of the second sub-linear polarizer and the horizontal polarization direction is 22.5 degrees, and in a similar fashion, an included angle between a polarization direction of the sixteenth sub-linear polarizer and the horizontal polarization direction is 180 degrees. The pixel size of the high-sensitivity CMOS camera is 2048× 2048, and the individual pixel size is 6.5 μm.

The synchronous control system has a function for individual signal delay adjustment of four channels, which are able to achieve the external triggered delay adjustment of the shutter and the high-sensitivity CMOS camera in the data acquisition system and thus realize the capture of the single laser pulse.

The data reconstruction system is configured to execute an iterative Tikhonov regularization algorithm by a computer, specifically including the following steps: setting a data acquisition process as follows:

$$E(m,n)=HDRTI(x,y,t)+b, \quad (1)$$

in which E(m, n) denotes the optical energy measured at pixel (m, n) on the high-sensitivity CMOS camera (211), I(x, y, t) denotes an original dynamic scene, and b is noise, in which T is a time encoding operator determined by the time-polarization mapping relationship, R is a scene replication operator generated by the micro-lens array (207), D is an optical distortion operator generated by the spatial position difference among sixteen sub-lenses in the micro-lens array (207), and H is a circular convolution operator generated by polarization bandwidth of the linear polarizer array (210); and in order to restore the original dynamic scene, the inverse problem of formula (1) needs to be solved, that is, the iterative Tikhonov regularization is used to solve this problem by optimizing the following objective function, the objective function is expressed as follows:

$$\underset{I>I_S}{\mathrm{argmin}}\left\{\frac{1}{2}\|E - HDRTI\|_2^2 + \alpha\Lambda(I)\right\}, \quad (2)$$

in which $I_s$ is a threshold limit constant, $\|\bullet\|_2$ denotes 12 norm, $\alpha$ is a regularization parameter, and $\Lambda(I)$ denotes the Tikhonov regularization; in the process of image reconstruction, the two-dimensional image E(m, n) acquired by the data acquisition system is first segmented into sixteen sub-images with equal size, and then the optical distortion in each frame is calibrated by an image features recognition and matching algorithm. In the iterative optimization process, an L-curve method is used to find the regularization parameter a, and the specific iterative steps are as follows:

$$(H^*H+\alpha\Lambda)I^{(k)}=H^*I+\alpha I^{(k-1)}, \quad (3)$$

after k times of iterative optimization, an iterative optimization result $I^{(k)}$ is obtained, and finally, information without spatiotemporal aliasing is obtained by using the intensity threshold limit $I_s$, the original dynamic scene $\hat{I}(x, y, t\ a)$ is obtained, LIE 16.

The present disclosure has the beneficial effects that by means of single exposure, the (x, y, t) information of the dynamic scene is obtained, the time resolution is 850 fs, the spatial resolution is 17.5 μm (in the field of view of 700 μm×700 μm), and the number of imaging frames is sixteen.

According to the present disclosure, a rotational polarized laser pulse generated by an optical rotational dispersion crystal is used as illumination light of a dynamic scene, and the original dynamic scene information is retrieved by using a polarization filtering method and an iterative Tikhonov deconvolution reconstruction algorithm, and thus ultrafast transient scenes or irreversible events can be photographed.

DETAILED DESCRIPTION OF THE EMBODIMENTS

The present disclosure is described in detail below with reference to the accompanying drawings and embodiments.

Figure 1:
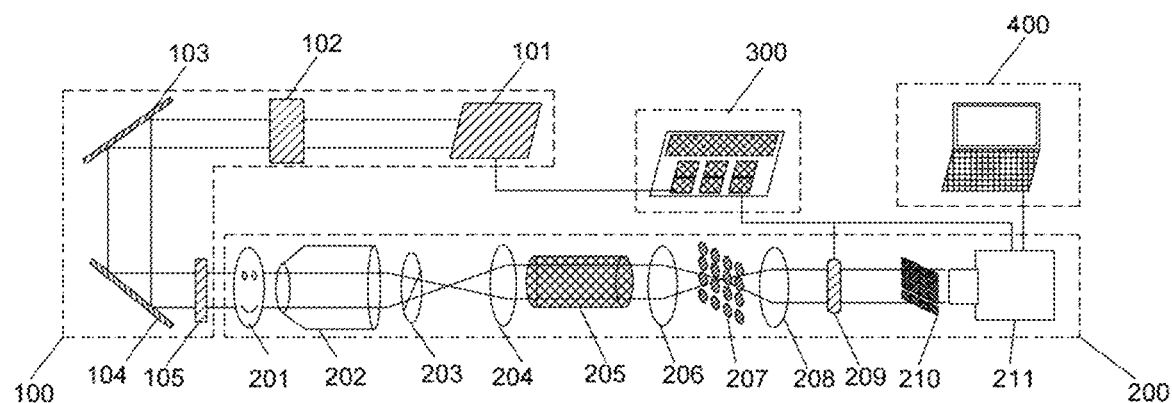
FIG. 1 is a setup of a system in accordance with the present disclosure.

Referring to FIG. 1, the apparatus includes an active illumination system 100, a data acquisition system 200, a synchronous control system 300, and a data reconstruction system 400.

A femtosecond laser system 101, a pulse stretcher 102, a first mirror 103, a second mirror 104, and a scattering medium 105 of the active illumination system 100 are optically connected in sequence. A dynamic scene 201, a microscope objective 202, a linear polarizer 203, a first lens 204, an optical rotational dispersion crystal 205, a second lens 206, a micro-lens array 207, a third lens 208, a shutter 209, a linear polarizer array 210, and a high-sensitivity CMOS camera 211 of the data acquisition system 200 are optically connected in sequence, where the scattering medium 105 of the active illumination system 100 is optically connected to the dynamic scene 201 of the data acquisition system 200. The synchronous control system 300 is connected to the femtosecond laser system 101 in the active illumination system 100, as well as the shutter 209 and the high-sensitivity CMOS camera 211 in the data acquisition system 200. The data reconstruction system 400 is connected to the high-sensitivity CMOS camera 211 in the data acquisition system 200.

The synchronous control system 300 is composed of a digital delay generator, which possesses individual signal delay adjustment of four channels. The capture of single laser pulse can be achieved by adjusting the external trigger delay of the shutter 209 and the high-sensitivity CMOS camera 211 in the data acquisition system 200.

The data reconstruction system 400 is mainly composed of a computer. An iterative Tikhonov regularization algorithm is used for reconstruction, the acquired data is reconstructed to finally restore an original dynamic scene.

The apparatus includes an active illumination system 100, a data acquisition system 200, a synchronous control system 300, and a data reconstruction system 400. The active illumination system is configured to generate a specific chirped scattered laser, and the data acquisition system is configured to acquire data of a dynamic scene. In the data acquisition process, the high-sensitivity CMOS camera is configured to acquire a two-dimensional image containing sixteen sub-images, and then the data reconstruction system is configured to deal with the acquired two-dimensional image. That is, the iterative Tikhonov regularization algorithm is used to process the sixteen frames of sub-images, so as to finally restore three-dimensional spatiotemporal (x, y, information of the dynamic scene.

In the present disclosure, the ultrafast photographing apparatus operates as follows:

Referring to FIG. 1, a femtosecond laser pulse is generated by the femtosecond laser system 101 of the active illumination system 100, is chirped and broadened by the pulse stretcher 102, and then passes through the first mirror 103, the second mirror 104 and the scattering medium 105 in sequence to generate illumination scattered light to irradiate on the dynamic scene 201 in the data acquisition system 200. The microscope objective 202 is configured to collect the illumination scattered light transmitting through the dynamic scene, and then passes through the linear polarizer 203, thus making the transmitted light be completely linearly polarized light. Then the linear polarized light passes through the first lens 204, the optical rotational dispersion crystal 205 and the second lens 206 in sequence, in which the optical rotational dispersion crystal 205 may rotate a polarized direction of the transmitting laser to make different wavelengths correspond to different polarization angles. The modulated scattered light which carries the spatiotemporal information continues to pass through the micro-lens array 207, the third lens 208, the shutter 209, the linear polarizer array 210 and the high-sensitivity CMOS camera 211, in which the light passing through the micro-lens array 207 is split into sixteen sub-beams, which are in one-to-one correspondence with the spatial positions of the sixteen linear sub-polarizers in the linear polarizer array 210, so as to achieve individual polarized direction by filtering the sub-beams; and the shutter 209 is configured to capture single laser pulse, and finally, the high-sensitivity CMOS camera 211 collects a two-dimensional image containing sixteen sub-images. In the data acquisition process, the digital delay generator of the synchronous control system 300 may adjust delay of the shutter 209 and the CMOS camera 211 in the data acquisition system 200, so as to guarantee the single exposure capture of the camera from the dynamic scene. The data reconstruction system 400 is configured to reconstruct the image acquired by the high-sensitivity CMOS camera 211. That is, the iterative Tikhonov regularization algorithm is used to process the sixteen frames of sub-images, so as to restore three-dimensional spatiotemporal (x, y, t) information of the dynamic scene finally.

EMBODIMENT

Referring to FIG. 1, a laser pulse generated by the femtosecond laser system 101 used in this embodiment is a femtosecond laser pulse, which has a single pulse duration of 50 fs, a repetition frequency of 100 Hz, a spectral width of 40 nm, a wavelength range from 780 nm to 820 nm, and single pulse energy of 3 mJ.

The pulse stretcher 102 in the active illumination system 100 can cover the broadening range of the femtosecond pulse from 2 ps to 200 ps.

The optical rotational dispersion crystal 205 of the data acquisition system 200 is a right-handed quartz optically crystal produced by Fujian Fujing Technology Co., Ltd., which has a thickness of 140 mm, can be configured to modulate the wavelength range from 780 nm to 820 nm, and enable a polarization angle of the spectral bandwidth of 40 nm to just rotate by 180 degrees, thus making individual wavelengths correspond to different linear polarization angles, i.e., 780 nm corresponds to a polarization angle of 0 degree, 781 nm corresponds to a polarization angle of 4.5 degrees, and in a similar fashion, 820 nm corresponds to a polarization angle of 180 degrees, in which 0 degree polarization angle corresponds to a horizontal polarization direction and 90 degree polarization angle corresponds to a vertical polarization direction, and a corresponding relationship between the polarization angle and the time can be obtained by further utilizing the corresponding relationship between the wavelength and the time.

The micro-lens array 207 of the data acquisition system 200 is a 4×4 lens array produced by Highlight Optics, where the size of an individual sub-lens is 1 mm, the focal length of sub-lens is 60 mm, and the spacing distance between the sub-lenses is 50 μm.

The linear polarizer array 210 of the data acquisition system 200 is obtained by laser cutting the same linear polarizer along different directions. The extinction ratio of each sub-linear polarizer is 2000:1, and the difference of included angles between polarization directions of the linear sub-polarizers and the horizontal polarization direction is 11.25 degrees in turn.

The shutter 209 of the data acquisition system 200 is produced by Newport Corporation of the United States, with the fastest opening and closing response time of 5 ms.

The high-sensitivity CMOS camera of the data acquisition system 200 is Sona 4.2B series camera produced by Andor Technology, which has high sensitivity characteristics and external trigger operation mode.

The digital delay generator 302 used in the synchronous control system 300 is Stanford Research Systems DG645, which has a function for individual time-lapse adjustment of four channels and the time-lapse adjustment accuracy up to 1 ps.

The computer of the data reconstruction system 400 is configured to process the sixteen frames of sub-images by using the iterative Tikhonov regularization algorithm, so as to finally restore three-dimensional spatiotemporal information of the dynamic scene.

Figure 2:
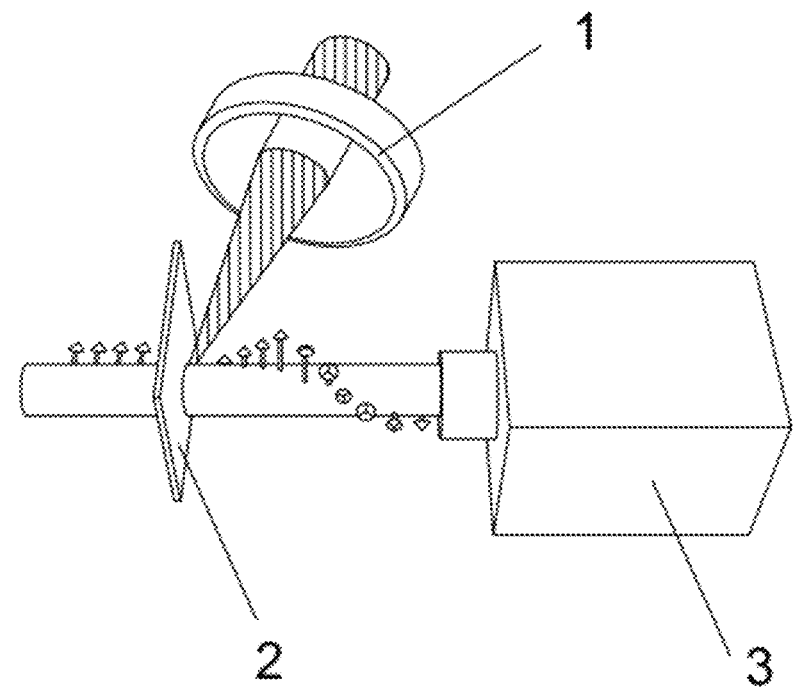
FIG. 2 is a diagram of an experimental system for photographing an ablation scene in an embodiment 1.

Referring to FIG. 2, a plano-convex lens 1 is configured to focus and graze a pump femtosecond laser to the surface of an indium tin oxide film 2 to generate an ablation dynamic scene, and the apparatus 3 of the present disclosure is used to capture the ablation dynamic scene. The used pump femtosecond laser has a central wavelength of 400 nm, a single pulse duration of fs, and a repetition rate of 100 Hz. The thickness of the indium tin oxide film is 170 nm, and the substrate is fused quartz glass with a thickness of 1 mm.

When the active illumination system 100 operates, a femtosecond laser pulse is generated by the femtosecond laser system 101, and then passes through the pulse stretcher 102, the first mirror 103, the second mirror 104 and the scattering medium 105 in sequence to generate a chirped illumination scattered laser.

When the data acquisition system 200 operates, the illumination scattered laser generated by the active illumination system 100 irradiates on a dynamic scene generated by focusing the pump laser on the surface of the film. The illumination scattered laser carrying the dynamic scene is collected by the microscope objective 202 and passes through the first lens 204, the optical rotational dispersion crystal 205, the second lens 206, the micro-lens array 207, the third lens 208, the shutter 209, the linear polarizer array 210 and the highly sensitive CMOS camera 211 in sequence.

When the synchronous control system 300 operates, the digital delay generator of the synchronous control system 300 is configured to control the time delay of the shutter 209 and the highly sensitive CMOS camera 211, thus capturing the dynamic scene synchronously.

When the data reconstruction system 400 operates, the computer of the data construction system 400 is configured to reconstruct the image acquired by the high-sensitivity CMOS camera 211 during the operation of the data acquisition system 200. That is, the iterative Tikhonov regularization algorithm is used to process the sixteen frames of sub-images, so as to finally restore three-dimensional spatiotemporal (x, y, t) information of the dynamic scene. The data acquisition process is set as follows:

$$E(m,n) = HDRTI(x,y,t) + b, \quad (1)$$

E(m, n) denotes optical energy measured by the high-sensitivity CMOS camera at pixel (m, n), I(x, y, t) is the original dynamic scene, and b is the noise. T is a time encoding operator determined by the time-polarization mapping relationship, R is a scene replication operator generated by the micro-lens array, D is an optical distortion operator caused by the difference of spatial positions among sixteen sub-lenses in the micro-lens array, and H is a circular convolution operator generated by the polarization bandwidth of the linear polarizer array. In order to restore the original dynamic scene, it is necessary to solve the inverse problem of formula (1). That is, the iterative Tikhonov regularization is used to solve this problem by optimizing the following objective function, the objective function can be expressed as:

$$\underset{I > I_S}{\operatorname{argmin}} \left\{ \frac{1}{2} \| E - HDRTI \|_2^2 + \alpha \Lambda(I) \right\}, \quad (2)$$

in which Is is the threshold limit constant, $\|\cdot\|_2$ denotes $I_2$ Norm, $\alpha$ is a regularization parameter, $\Lambda(I)$ denotes the Tikhonov regularization. In the process of image reconstruction, the two-dimensional image E(m, n) acquired by the data acquisition system is first segmented into sixteen sub-images with equal size, and then the optical distortion in each frame is calibrated by image features recognition and matching (IFRM) algorithm. In the iterative optimization process, L-curve method is used to find the regularization parameters a, with specific iterative steps as follows:

$$(H^*H + \alpha \Lambda)I^{(k)} = H^*I + \alpha I^{(k-1)}, \quad (3)$$

after k times of iterative optimization, an iterative optimization result $I^{(k)}$ is obtained, and finally, information without spatiotemporal aliasing is obtained by using the intensity threshold limit $I_s$, the original dynamic scene $\hat{I}(x, y, t_d)$ is obtained, $t_d \in 16$.

Figure 3:
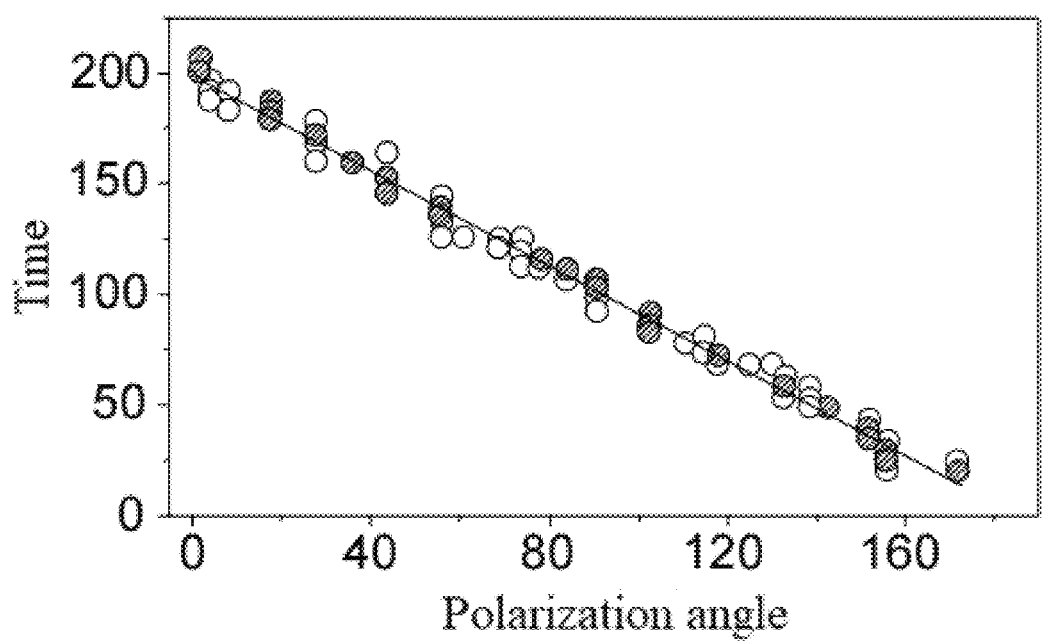
FIG. 3 is a diagram of the time-polarization mapping relationship of illumination light used in an embodiment 1.

FIG. 3 shows a diagram of the time-polarization mapping relationship of an illumination scattered laser in embodiment 1, the abscissa is a polarization angle, the ordinate is time, and the unit is ps. Through the time-polarization mapping relationship, the time instant corresponding to each sub-image can be determined.

Figure 4:
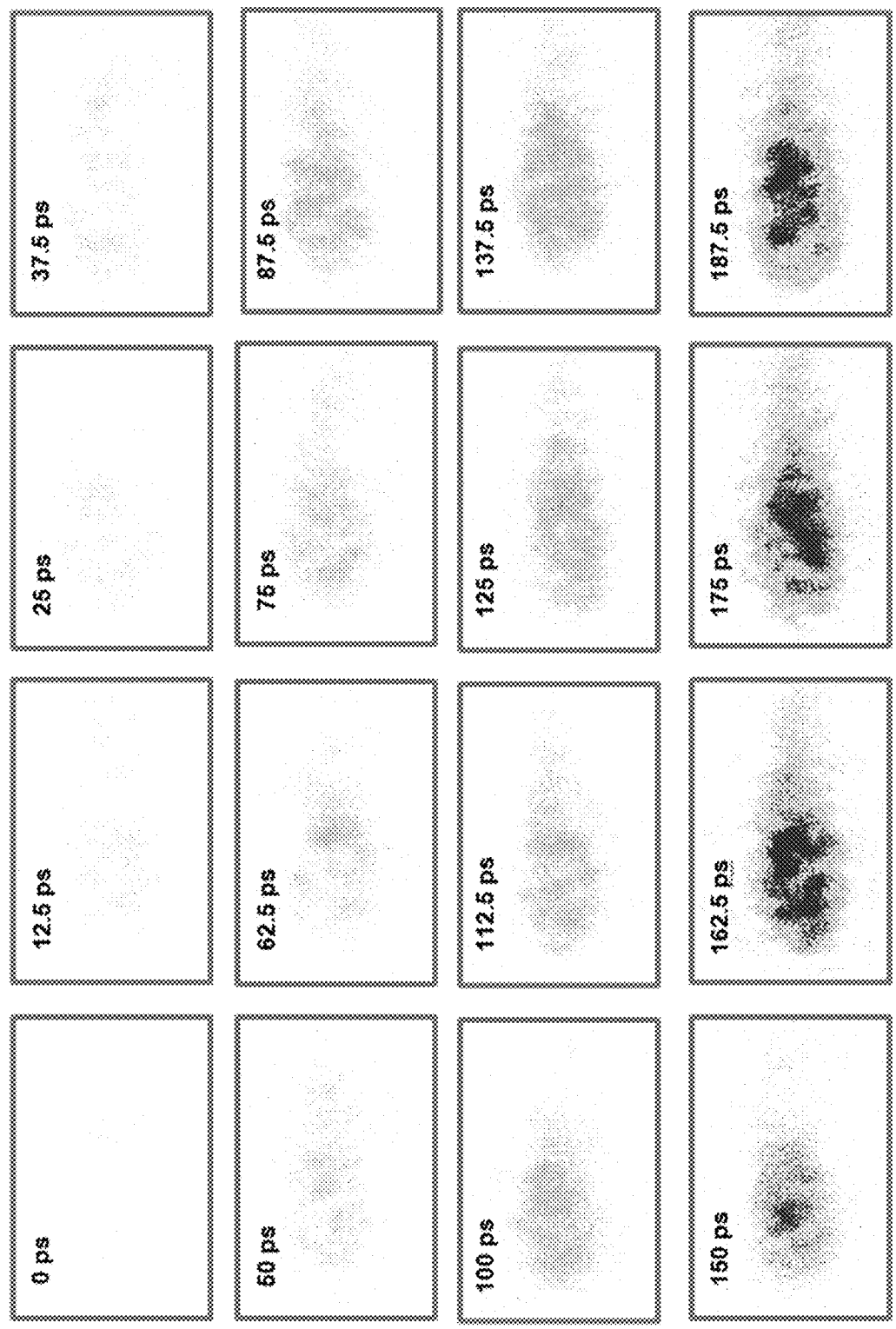
FIG. 4 is a spatiotemporal three-dimensional reconstructed result from embodiment 1.

The ablation dynamic scene of the indium tin oxide film is photographed by the apparatus of the present disclosure, and sixteen frames of images recovered by using the iterative Tikhonov regularization algorithm are shown in FIG. 4, each sub-image denotes the isolated time instant, and the time interval is 12.5 ps. The power density of the pump femtosecond laser is about 0.229 J/cm², which does not reach the ablation threshold of the fused quartz glass.

Generally speaking, ultrafast photographing apparatus based on polarization-time mapping is disclosed by the present disclosure, which is configured to capture dynamic scenes based on the polarization-time mapping relationship, belongs to a single-shot photographing apparatus, and can realize the observation of the spatiotemporal three-dimensional (x, y, t) information of the ultrafast dynamic scene.

The foregoing is only the preferred embodiment of the present disclosure, and is not intended to limit the present disclosure. Any modification, equivalent replacement, improvement, etc. made within the spirit and principles of the present disclosure should be included in the scope of protection of the present disclosure.

What is claimed is:

1. An ultrafast photographing apparatus based on polarization-time mapping, comprising:
   an active illumination system (100), consisting of a femtosecond laser system (101), a pulse stretcher (102), a first mirror (103), a second mirror (104) and a scattering medium (105) which are optically connected in sequence;
   a data acquisition system (200), consisting of a dynamic scene (201), a microscope objective (202), a linear polarizer (203), a first lens (204), an optical rotational dispersion crystal (205), a second lens (206), a micro-lens array (207), a third lens (208), a shutter (209), a linear polarizer array (210), and a high-sensitivity CMOS camera (211) which are optically connected in sequence, wherein the dynamic scene (201) is optically connected to the scattering medium (105) in the active illumination system (100);
   a synchronous control system (300), consisting of a digital delay generator, which is connected to the femtosecond laser system (101) in the active illumination system (100), as well as the shutter (209) and the high-sensitivity CMOS camera (211) in the data acquisition system (200); and
   a data reconstruction system (400), consisting of a computer, which is connected to the high-sensitivity CMOS camera (211) in the data acquisition system (200).

2. The ultrafast photographing apparatus based on polarization-time mapping according to claim 1, wherein a femtosecond laser pulse generated by the femtosecond laser system (101) of the active illumination system (100) has a pulse duration of 60 fs, a wavelength range from 780 nm to 820 nm, a spectral bandwidth of 40 nm, a repetition frequency of 100 Hz, and a single pulse energy of at least 3 mJ; the pulse stretcher (102) is able to cover a chirping range of the femtosecond laser pulse from 2 ps to 200 ps; and the scattering medium (105) is an engineering scatterer and is configured to perform decoherence on the femtosecond laser pulse.

3. The ultrafast photographing apparatus based on polarization-time mapping according to claim 1, wherein the linear polarizer (203) of the data acquisition system (200) is a linear polarizer with a high extinction ratio, and the extinction ratio of the linear polarizer in a wavelength range from 780 nm to 820 nm is at least 5000:1, thus guaranteeing that a transmitted light beam is linearly polarized; the micro-lens array (207) is a 4×4 lens array for generating sixteen sub-beams, wherein a size of each sub-lens in the micro-lens array (207) is from 500 μm to 1 mm, a focal length of the sub-lens is at least 60 mm, and a spacing distance between the sub-lens and an adjacent sub-lens is from 20 μm to 50 μm; the optical rotational dispersion crystal (205) is a right-handed quartz crystal with a crystal thickness of 140 mm, which is configured to modulate the wave-length range from 780 nm to 820 nm, and enable a polarization angle of a spectral bandwidth of 40 nm to just rotate by 180 degrees; a mapping relationship between polarization and time is obtained by further utilizing a relationship between spectrum and time mapping; a fastest opening and closing response time of the shutter (209) in an external trigger mode is 5 ms, so as to capture a single laser pulse; the linear polarizer array (210) is a 4×4 linear polarizer array, a size of each sub-linear polarizer in the linear polarizer array (210) is 3 mm×3 mm, a spacing distance between the sub-linear polarizer and an adjacent sub-linear polarizer is 300 and the extinction ratio of the sub-linear polarizer is at least 2000:1; an included angle between a polarization direction of a first sub-linear polarizer and a horizontal polarization direction is 11.25 degrees, an included angle between a polarization direction of a second sub-linear polarizer and the horizontal polarization direction is 22.5 degrees, and in a similar fashion, an included angle between a polarization direction of a sixteenth sub-linear polarizer and the horizontal polarization direction is 180 degrees; and a pixel number of the high-sensitivity CMOS camera (211) is 2048×2048, and an individual pixel size is 6.5 μm.

4. The ultrafast photographing apparatus based on polarization-time mapping according to claim 1, wherein the synchronous control system (300) has a function for individual signal delay adjustment of four channels, which are able to achieve external triggered delay adjustment of the shutter (209) and the high-sensitivity CMOS camera (211) in the data acquisition system (200), and thus realize a capture of a single laser pulse.

5. The ultrafast photographing apparatus based on polarization-time mapping according to claim 1, wherein the data reconstruction system (400) is configured to execute an iterative Tikhonov regularization algorithm by a computer, specifically comprising the following steps: setting a data acquisition process as follows:

$$E(m,n) = HDRTI(x,y,t) + b, \quad (1)$$

wherein $E(m, n)$ denotes optical energy measured at pixel $(m, n)$ on the high-sensitivity CMOS camera (211), $I(x, y, t)$ denotes an original dynamic scene, and b is noise, in which T is a time encoding operator determined by a mapping relationship between the polarization and time, R is a scene replication operator generated by the micro-lens array (207), D is an optical distortion operator generated by a spatial position difference among sixteen sub-lenses in the micro-lens array (207), and H is a circular convolution operator generated by polarization bandwidth of the linear polarizer array (210); and in order to restore the original dynamic scene, an inverse problem of formula (1) needs to be solved, that is, the iterative Tikhonov regularization is used to solve the problem by optimizing the following objective function, the objective function is expressed as follows:

$$\operatorname*{argmin}_{I > I_S} \left\{ \frac{1}{2} \|E - HDRTI\|_2^2 + \alpha \Lambda(I) \right\}, \quad (2)$$

wherein $I_s$ is a threshold limit constant, $\|\cdot\|_2$ denotes $I_2$ norm, $\alpha$ is a regularization parameter, and $\Lambda(I)$ denotes the Tikhonov regularization; in the process of image reconstruction, a two-dimensional image represented by $E(m, n)$ acquired by the data acquisition system is first segmented into sixteen sub-images with equal size, and then optical distortion in each frame is calibrated by an image features recognition and matching algorithm; and in the iterative optimization process, an L-curve method is used to find the regularization parameter a, and the specific iterative steps are as follows:

$$(H^*H + \alpha \Lambda)I^{(k)} = H^*I + \alpha I^{(k-1)}, \text{ and} \quad (3)$$

after k times of iterative optimization, an iterative optimization result $I^{(k)}$ is obtained, and finally, information without spatiotemporal aliasing is obtained by using an intensity threshold limit $I_s$, the original dynamic scene $\hat{I}(x, y, t_d)$ is obtained, $t_d \in 16$.

* * * * *